US007301239B2

(12) United States Patent
Wang et al.

(10) Patent No.: US 7,301,239 B2
(45) Date of Patent: Nov. 27, 2007

(54) WIRING STRUCTURE TO MINIMIZE STRESS INDUCED VOID FORMATION

(75) Inventors: Chien-Jung Wang, Kaohsiung (TW); Su-Chen Fan, Chung-Li (TW); Ding-Da Hu, Taichung (TW); Hsueh-Chung Chen, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 80 days.

(21) Appl. No.: 10/899,252

(22) Filed: Jul. 26, 2004

(65) Prior Publication Data

US 2006/0019414 A1 Jan. 26, 2006

(51) Int. Cl.
*H01L 29/41* (2006.01)

(52) U.S. Cl. ................. 257/767; 257/48; 257/E29.112; 438/622; 438/637; 438/468; 438/18

(58) Field of Classification Search ................ 438/927, 438/466, 468, 18, 637, 622; 257/767, 48, 257/E29.112

See application file for complete search history.

(56) References Cited

U.S. PATENT DOCUMENTS 5,264,377 A * 11/1993 Chesire et al. ................ 438/11
5,391,920 A * 2/1995 Tsuji .......................... 257/758
5,504,017 A 4/1996 Yue et al.
5,614,764 A * 3/1997 Baerg et al. ................ 257/767
5,661,345 A * 8/1997 Wada et al. ................ 257/767
5,900,735 A * 5/1999 Yamamoto .................. 324/537
6,004,827 A 12/1999 Ryan
6,191,481 B1 * 2/2001 Bothra et al. ............... 257/734
6,306,732 B1 10/2001 Brown
6,320,391 B1 * 11/2001 Bui ............................ 324/537
6,362,634 B1 * 3/2002 Jarvis et al. ................ 324/719
6,498,384 B1 12/2002 Marathe
6,559,475 B1 * 5/2003 Kim ............................ 257/48
6,570,181 B1 5/2003 Graas et al.
6,725,433 B1 * 4/2004 Hau-Riege et al. ............ 716/4
6,747,445 B2 * 6/2004 Fetterman et al. ......... 324/71.1

(Continued)

OTHER PUBLICATIONS

Yoshida, K., et al., "Stress-Induced Voiding Phenomena for an Actual CMOS LSI Interconnects," IEEE, 2002.

(Continued)

*Primary Examiner*—B. William Baumeister
*Assistant Examiner*—Steven J. Fulk
(74) *Attorney, Agent, or Firm*—Slater & Matsil, L.L.P.

(57) ABSTRACT

A wiring structure with improved resistance to void formation and a method of making the same are described. The wiring structure has a first conducting layer that includes a large area portion which is connected to an end of a protrusion with a plurality of "n" overlapping segments and at least one bending portion. The other end of the protrusion is connected to the bottom of a via which has an overlying second conducting layer. A bend is formed by overlapping the ends of two adjacent segments at an angle between 45° and 135°. The protrusion may also include at least one extension at a segment end beyond a bend. A bending portion and extension are used as bottlenecks to delay the diffusion of a vacancy from the large area portion to the vicinity of the via and is especially effective for copper interconnects or in a via test structure.

38 Claims, 8 Drawing Sheets

U.S. PATENT DOCUMENTS

| | | | | |
|---|---|---|---|---|
| 6,831,365 | B1 * | 12/2004 | Yao et al. | 257/758 |
| 6,908,847 | B2 * | 6/2005 | Saito et al. | 438/627 |
| 2003/0082836 | A1 * | 5/2003 | Fetterman et al. | 438/14 |
| 2004/0207383 | A1 * | 10/2004 | Wang | 324/71.2 |
| 2004/0262604 | A1 * | 12/2004 | Lee | 257/48 |

OTHER PUBLICATIONS

Ogawa, E. T., et al., “Stress-Induced Voiding Under Vias Connected to Wide Cu Metal Leads” IEEE, International Reliability Physics Symposium Apr. 7-11, 2002.

* cited by examiner

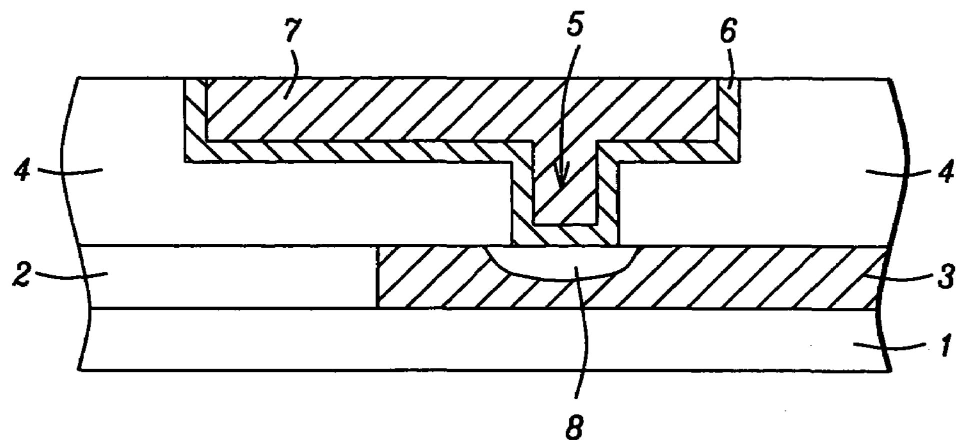
FIG. 1 - Prior Art
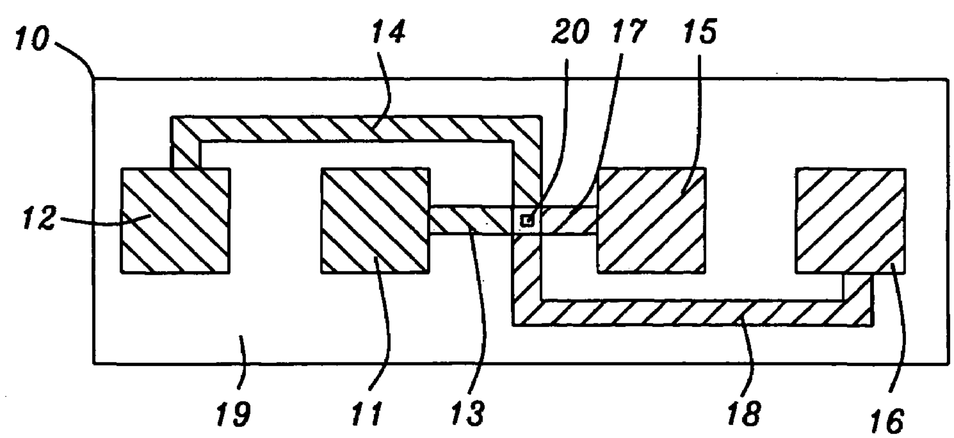
FIG. 2

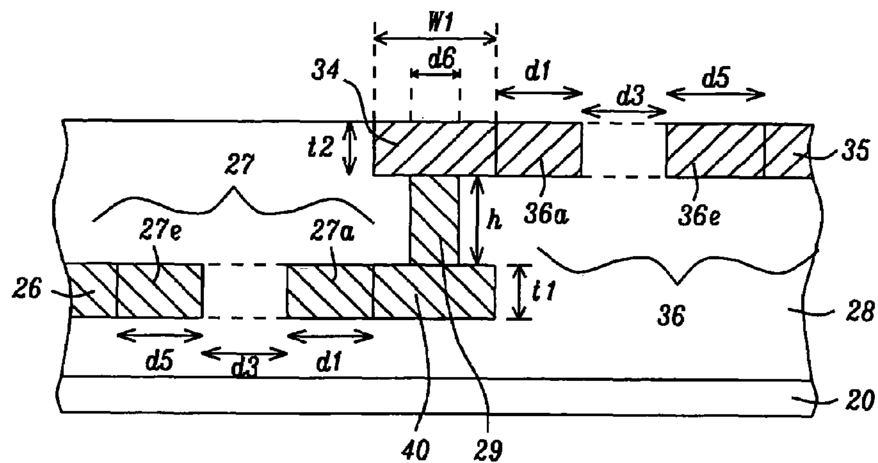
FIG. 7
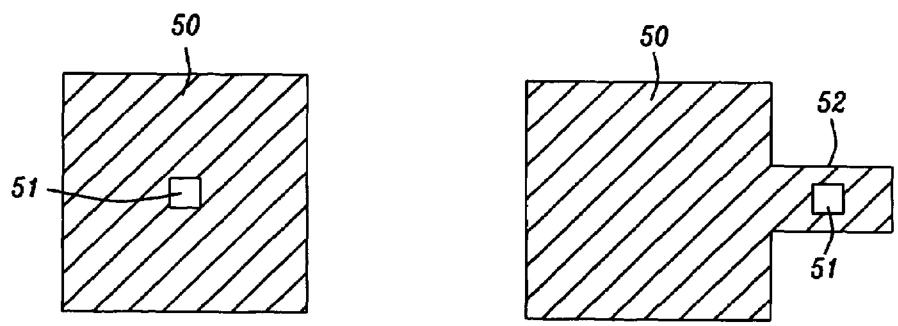
FIG. 8a – Prior Art
FIG. 8b – Prior Art

WIRING STRUCTURE TO MINIMIZE STRESS INDUCED VOID FORMATION

TECHNICAL FIELD

The invention relates to the field of fabricating an integrated circuit and other electronic devices and in particular to a wiring structure with a higher resistance to stress induced void formation in via reliability testing and in multi-level interconnects.

BACKGROUND

During the "back end of line" (BEOL) portion of fabricating a microelectronic device, several conducting layers are stacked on each other in sequential operations. The conducting layers, which are also referred to as interconnects, are separated by one or more dielectric layers to electrically insulate adjacent interconnects and to prevent undesirable crosstalk between the conducting layers. The interconnects are in the form of vias and lines or may be contacts to source/drain regions in the substrate. There is a significant challenge to improve the reliability of the final device because the repeated passage of current through an electrical circuit stresses the (metal) conductors and may induce voids that cause device failure. Stress induced voiding is a common problem in multi-level interconnects, particularly those comprised of copper. Reliability is an increasing concern as interconnects become smaller and higher current densities are employed. One leading cause of device failure is electromigration that forms a void by the movement of metal ions or vacancies in a conductive element as a result of a current passing through it. A continuing trend is to manufacture devices in which failure mechanisms are substantially delayed or prevented from occurring by incorporating new designs and improved materials.

While operating an integrated circuit device, a current typically flows from a first conducting layer through a diffusion barrier at the bottom of a via and then through the via before reaching a second conducting layer. For example, consider the interconnect structure in FIG. 1 in which a first conducting layer 3 is formed in a first dielectric layer 2 on a substrate 1. Typically, the first conducting layer 3 is coplanar with the first dielectric layer 2. A second dielectric layer 4 is deposited on the first dielectric layer 2 and on the first conducting layer 3. Optionally, the first and second dielectric layers 2, 4 are part of a stack of dielectric layers further comprised of one or more etch stop layer or barrier layers as is appreciated by those skilled in the art.

A conventional patterning and metal deposition (damascene) sequence is used to form a via 5 above the first conducting layer 3 and a second conducting layer 7 aligned above the via 5. Typically, a diffusion barrier layer 6 is deposited in a damascene opening prior to the second metal deposition. A compressive stress builds up on the downstream side of the diffusion barrier layer 6 while a tensile stress increases with time on the opposite side of the diffusion barrier at the bottom of the via 5. There tends to be a movement of metal in the first conducting layer 3 that leads to void 8 formation in locations of tensile stress such as immediately upstream in the current flow from the diffusion barrier 6. Thus, a portion of the first conducting layer that is adjacent to the via 5 is especially susceptible to void formation due to electromigration. Furthermore, a first conducting layer 3 with a large surface area is likely to form a void more readily. A via test structure for monitoring the effect of a first and second conducting layer pattern on void formation is desirable to enable a better understanding of how design and materials may be optimized to provide higher reliability.

Void detection in metallization patterns is accomplished in U.S. Pat. No. 5,504,017 by passing a current across a metal layer to generate a hot spot in a barrier layer adjacent to the void. The hot spot is detected by an infrared technique or by coating a liquid crystalline material on the metal and measuring a calorimetric response.

A test structure is disclosed in U.S. Pat. No. 6,004,827 in which a metal runner is formed on a substrate. After a sintering process, a dielectric layer is removed to reveal bumps on the runner. When bump concentration at a given location is more than 20% higher than the average bump density, long term failure is predicted at that site.

In U.S. Pat. No. 6,498,384, a test structure is fabricated on a semiconductor wafer and comprises a first layer of metal that has second and fourth channels which are connected in series by vias with first, third, and fifth channels in a second metal layer. Openings in a capping layer allow the first and fifth channels to be probed for resistance and compared to a calibration measurement.

U.S. Pat. No. 6,320,391 describes a long narrow test conductor that is connected to an extension metal conductor on each end by a plurality of vias that avoids a current crowding effect when placing only one via at each end of the test conductor. The test structure is compatible with a high stressing current.

In U.S. Pat. No. 6,570,181, a reliability test structure is described as having a chain of a plurality of long test links formed in a first metal layer that are alternately interconnected by a plurality of short links formed in a second metal layer. The long and short links may be arranged in a serpentine configuration.

K. Yoshida, T. Fujimaki, K. Miyamoto, T. Honma, H. Kaneko, H. Nakazawa, and M. Morita describe in "Stress-Induced Voiding Phenomena for an Actual CMOS LSI Interconnects" in Electron Devices Meeting, 2002, IEEE, Vol. 8-11, pages 753 to 756 that a vacancy in a bulk metal is able to diffuse through a wide metal layer or in a delayed fashion through a narrow metal layer before reaching a via that is connected to the metal layer. Over time, enough vacancies accumulate to form a void at the via bottom. For example, a void occurs more rapidly below the via 51 formed on a wide metal layer 50 in FIG. 8*a* than below a via 51 formed on an extension 52 from a wide metal layer 50 in FIG. 8*b*.

Therefore when performing reliability testing on an interconnect, conventional test structures typically underestimate the lifetime before device failure occurs because they fail to account for voids in a bulk metal such as a bonding pad or a large area metal layer that diffuse through a narrow metal connection to a via. A top-down view of a conventional four port Kelvin test structure 10 for performing resistance measurements is pictured in FIG. 2. A first metal layer comprised of a bond pad 11, a bond pad 12, and metal lines 13, 14 is formed on a semiconductor substrate (not shown). A second metal layer comprised of bond pad 15, bond pad 16, and metal lines 17, 18 is formed above the first metal layer and is separated from the first metal layer by a dielectric layer 19. The first metal lines 13, 14 are connected to the bottom of a via 20 while second metal lines 17, 18 are connected to the top of the via 20. A current of about 1 milliamp (ma), for example, is applied at bond pad 11 and a voltage V1 is measured at bond pad 12 and a voltage V2 is measured at bond pad 16. Bond pad 15 is grounded to zero volts. The resistance R of via 20 is determined as R=(V1−V2)/1 ma.

A reliability test is conducted by heating the substrate with the test structure at an elevated temperature of about 200° C. for a duration of time that may encompass hundreds of hours. Periodic resistance measurements are taken during the period that the substrate is heated and these measurements are compared with the original resistance value. Unfortunately, the reliability test underestimates the time before device failure since vacancies (not shown) in bond pad 11 migrate through metal line 13 to form a void (not shown) at the bottom of via 20 that increases via resistance R to an unacceptable level. Additionally, vacancies in bond pad 12 may migrate through metal line 14 to increase the rate of void formation at the bottom of via 20. It is understood that the dielectric layer 19 is typically a stack of dielectric layers which are not shown in order to simplify the drawing. Furthermore, first and second metal layers are typically enclosed within one or more diffusion barrier layers that are not pictured.

An improved test structure is needed that prevents vacancies in a bonding pad from interfering with the rate of void formation at the bottom of a via and thereby enables a more accurate determination of the via lifetime when device failure is expected to occur.

A commonly used method to offset the tendency for void formation in an interconnect is to apply a design rule that allows more vias to be connected to large area metal layers. However, this intended remedy has its own drawbacks since this type of design will lead to a higher total resistance and more risk in the via manufacturing process. The practice of adding more vias also increases the difficulty in checking the design rule.

In U.S. Pat. No. 5,614,764, an endcap reservoir is added to an interconnect line for extending electromigration lifetime and preventing void formation. However, the reservoir is not placed between the interconnect line and an adjoining via and therefore does not prevent vacancies from migrating within the interconnect to the via.

An alternative approach to mitigating the effect of electromigration is described in U.S. Pat. No. 6,306,732 in which an imperfect barrier layer is employed at the bottom of a via with a stronger barrier at all other portions of the via. Unfortunately, the problem of vacancy accumulation on the upstream side of the via is not prevented. Thus, an improved interconnect structure is required that overcomes the driving force for vacancies in a large area metal layer to migrate to the upstream side of a via and form a void that degrades device performance.

SUMMARY OF THE INVENTION

A preferred embodiment of the present invention provides a test structure for measuring via resistance that prevents or impedes vacancies in a void reservoir from migrating to the vicinity of a via and causing void formation.

Another preferred embodiment of the present invention provides a method and test structure for measuring via resistance that does not underestimate the lifetime of a via during reliability stress testing.

Another preferred embodiment of the present invention provides an interconnect structure that is able to minimize a stress induced voiding phenomenon and thereby improve the reliability and product yield of a device having a conducting layer connected to a via.

Yet another preferred embodiment of the present invention incorporates a protrusion at one end of a conducting layer wherein the protrusion forms a connection to a via and has at least one bending portion and extension to delay the diffusion of vacancies to the via.

Yet another preferred embodiment of the present invention provides a method for forming an interconnect with an improved resistance to stress induced void formation.

Embodiments of the present invention include a via test structure with two metal layers and a via that is fabricated in a dielectric layer on a substrate. Conventional methods are employed to fabricate a first metal layer which includes a first bonding pad that is connected by a first metal line to the bottom of the via and a second bonding pad that is connected by a second metal line to the bottom of the via. The second metal layer includes a first bonding pad that is connected by a first metal line to the top of the via, and a second bonding pad that is connected by a second metal line to the top of the via.

The first bonding pad in the first metal layer is used to apply a current to the bottom of the via and the second bonding pad in the first metal layer is used to determine the voltage at the bottom of the via. The first bonding pad in the second metal layer is grounded while the second bonding pad in the second metal layer is used to determine the voltage at the top of the via.

An advantageous feature of the present invention is that the first and second metal lines in the first and second metal layers have a wiring structure comprised of three segments including a second or middle segment which has a serpentine or bending pattern. The first segment of a first or second metal line in a first metal layer is comprised of one end of a metal line and is centered below the via while the first segment of the first or second metal line in the second metal layer is comprised of one end of a metal line and is centered above the via. The first segment of the first metal line in the first metal layer is aligned along a first axis while the first segment of the second metal line in the first metal layer is aligned along a second axis that is perpendicular to the first axis. The third segment of a first or second metal line includes the end of the metal line which contacts a bonding pad. Each segment of a metal line has a first width, a first length, a first thickness, and two ends.

The middle segment of each metal line in the via test structure includes at least one bending portion and has a plurality or "n" number of subsegments each having a length, a second width, a first thickness, and two ends. Each pair of overlapping subsegments forms a bend with an angle of about 45° to 135° for a total of (n−1) bends. In one embodiment, the middle segment has five subsegments and one bending portion comprised of three segments. In this example, a first subsegment formed along a first axis is connected on one end to the first segment and a second subsegment has one end that overlaps the other end of the first subsegment. There is a third subsegment with one end that overlaps the other end of the second subsegment, a fourth subsegment with one end that overlaps the other end of the third subsegment, and a fifth subsegment that overlaps the other end of the fourth subsegment. The fifth subsegment is preferably formed along the first axis or along an axis parallel to the first axis and has a second end which is connected to one end of the third segment. The bending portion is comprised of the second, third, and fourth subsegments that are not aligned along the first axis.

Alternatively, the middle segment may be comprised of four subsegments in which the first subsegment formed along a first axis has an end connected to one end of the first segment and a second subsegment has an end that overlaps the other end of the first subsegment. A third subsegment has an end which overlaps the other end of the second subsegment. There is a fourth subsegment formed along the first axis or on an axis parallel to the first axis that has an end which overlaps the other end of the third subsegment while the second end is connected to the third segment. The second and third subsegments form a bending portion that is not aligned along the first axis. In another embodiment there is a plurality of subsegments in the middle segment of each of the first and second metal lines and each middle segment has at least one bending portion comprised of a plurality of subsegments.

In embodiments of the present invention, the interconnect structure is fabricated by a damascene process in which a first conducting layer is formed in a stack of one or more dielectric layers which may include an etch stop layer on a substrate. A sequence that includes patterning, etching, deposition, and planarization steps is employed to fabricate the first conducting layer, which is coplanar with the top dielectric layer in the stack. The first conducting layer is comprised of a large area portion having a first length, first width, first thickness, and a plurality of sides and a protrusion with a second length, second width, first thickness, at least one bending portion and two ends wherein one end is connected to one side of the large area metal portion and the other end is subsequently connected to a via. Typically, the via and an overlying second conducting layer are formed in a second sequence of patterning, etching, deposition, and planarizing steps.

In another embodiment, the interconnect structure includes a protrusion with four overlapping segments and one bending portion comprised of two segments. One end of the first segment is connected to the large area portion of the first conducting layer and the other end overlaps an end of the second segment to form a first bend. The first segment is formed along a first axis. There is a third segment with an end that overlaps the other end of the second segment to form a second bend. A fourth segment has an end that overlaps the other end of the third segment to form a third bend. The fourth segment is preferably formed along the first axis or on an axis parallel to the first axis. The second end of the fourth segment is connected to the bottom of a via that adjoins an overlying second conducting layer. The bending portion is comprised of the second and third segments and each bend is formed at an angle of about 45° to 135°.

In yet another embodiment, the protrusion connected to the first conducting layer includes a plurality of "n" overlapping segments each having a first thickness and at least one bending portion comprised of three or more segments. For example, the protrusion may have five segments and a bending portion comprised of three segments. The first three segments are formed as described above. One end of the fourth segment overlaps the other end of the third segment to form a third bend. There is a fifth segment with an end that overlaps the other end of the fourth segment to form a fourth bend. The fifth segment is formed along the first axis or along an axis parallel to the first axis and has a second end that is connected to the bottom of a via with an overlying second conducting layer. The bending portion includes the second, third, and fourth segments. The total length of the protrusion is equal to the combined length of the segments which is preferably greater than about 10 microns. There are at least two more segments in the protrusion than in a bending portion and each bend is formed at an angle of about 45° to 135°.

In still another embodiment, the protrusion is further comprised of at least one extension at the end of a segment that elongates a segment beyond a bend and is comprised of the same material as in the first conducting layer. Preferably, an extension has a second width, a first thickness, and a length that is less than the length of the segment to which it is attached.

In yet another embodiment, the protrusion is further comprised of an extension on each end of a segment. For example, the third segment may have an extension on the end at the second bend and an extension on the end at the third bend. Optionally, an extension may be formed on each end of a segment at a bend. For example, there may be an extension on the end of the second segment at the second bend and an extension on the third segment at the second bend. In other words, there is a maximum amount of 2(n−1) extensions in an embodiment with "n" segments and (n−1) bends.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a cross-sectional view of a conventional interconnect structure with a via between two conducting layers and a void defect formed below the via in the first conducting layer.

FIG. 2 is a top-down view depicting a conventional four port Kelvin via test structure that includes bonding pads and metal lines that connect to a via.

FIG. 7 is a cross-sectional view from an angle that is perpendicular to the cross-sectional view in FIG. 6 and shows a second metal line in the first metal layer and a second metal line in the second metal layer according to a first embodiment.

FIG. *8a* is a top-down view of a via that is formed over a large area conducting layer and FIG. *8b* is a top-down view showing a via formed on a protrusion connected to a large area conducting layer in an interconnect structure.

Figure 9:
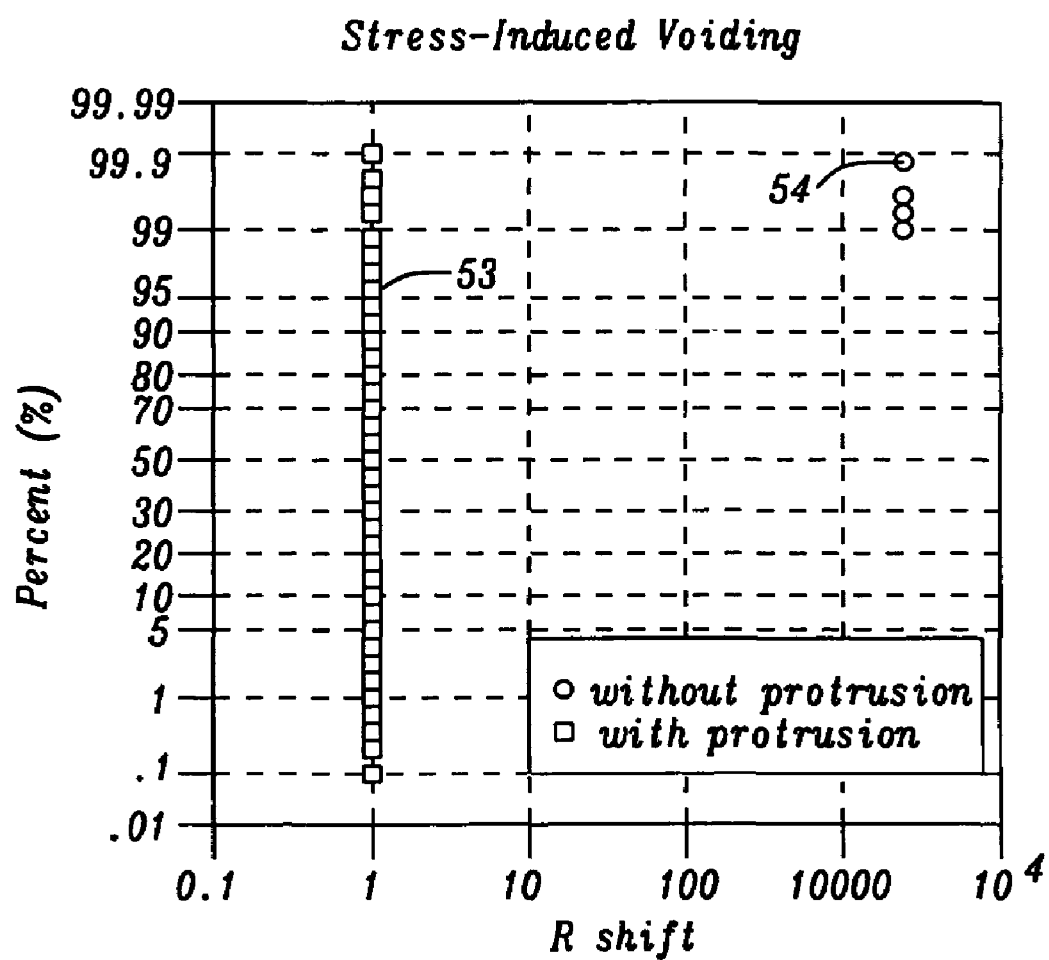

FIG. 9 is a plot showing a shift in resistivity for an interconnect having a via formed directly above a large area conducting layer compared with an interconnect having a via formed over a protrusion connected to a large area conducting layer.

Figure 10:
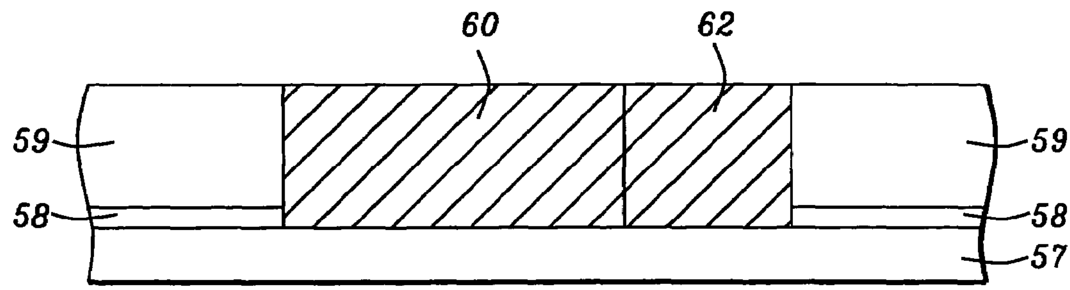

FIG. 10 is a cross-sectional view of a first conducting layer formed on a substrate according to the interconnect structure of a preferred embodiment of the present invention.

Figure 11:
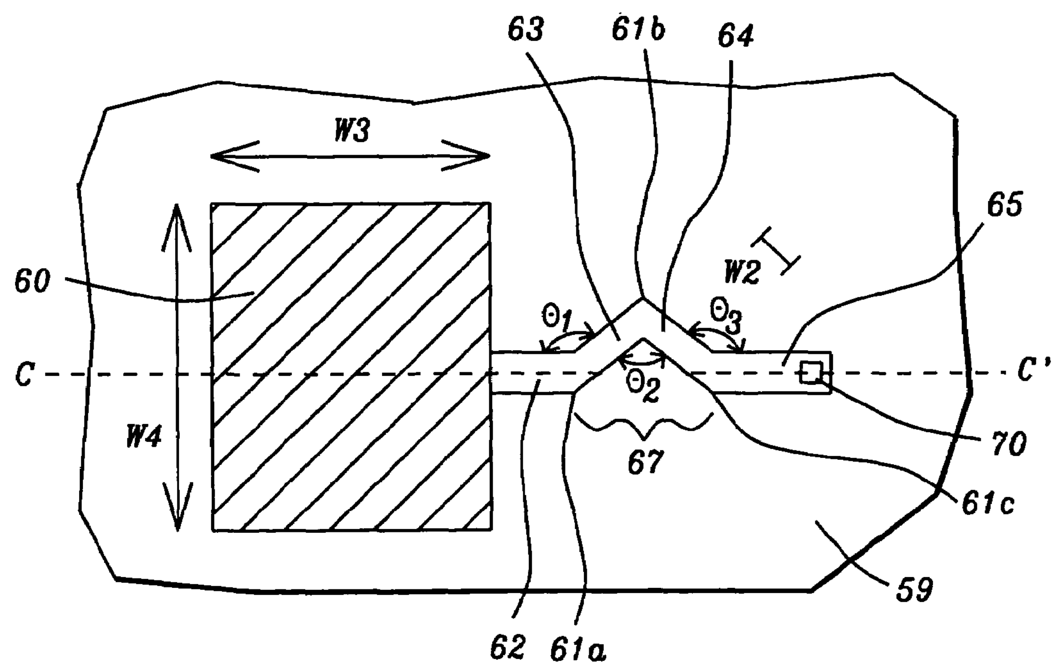

FIG. 11 is a top-down view showing a protrusion having four overlapping segments and one bending portion comprised of two segments in a first conducting layer according to another preferred embodiment of the present invention.

Figure 12:
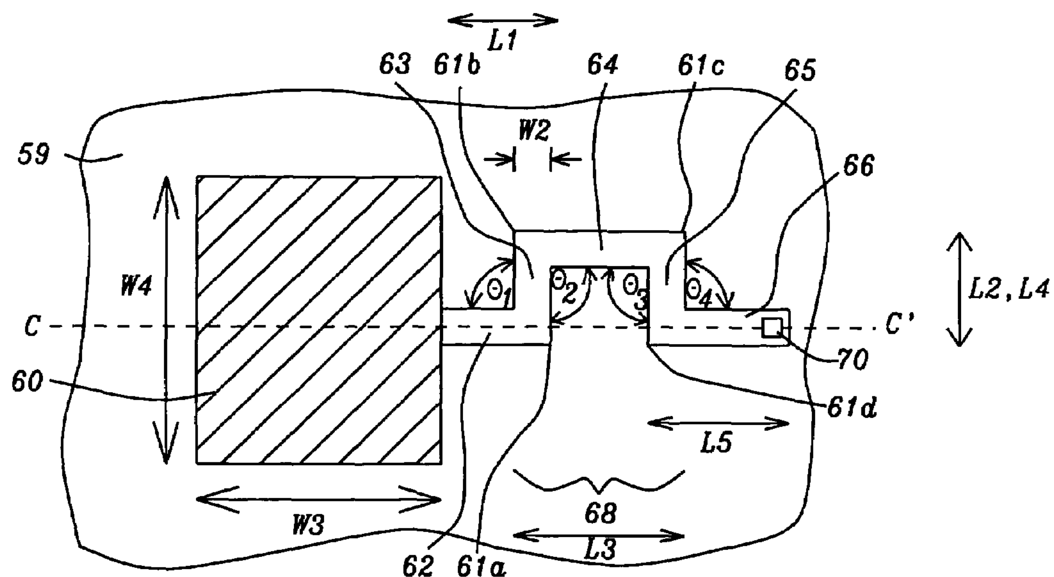

FIG. 12 is a top-down view showing a protrusion having five overlapping segments and one bending portion comprised of three segments in a first conducting layer according to yet another preferred embodiment of the present invention.

Figure 13:
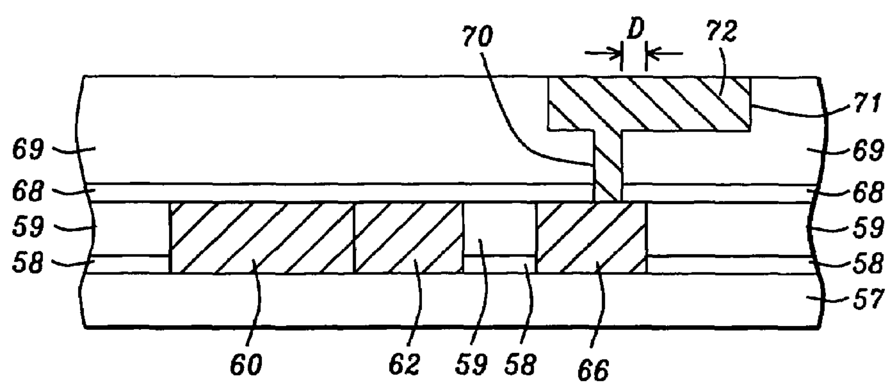

FIG. 13 is a cross-sectional view of the interconnect structure in FIG. 12 after a via and overlying second conducting layer are formed above the last segment in the protrusion according to a preferred embodiment of the present invention.

Figure 14:
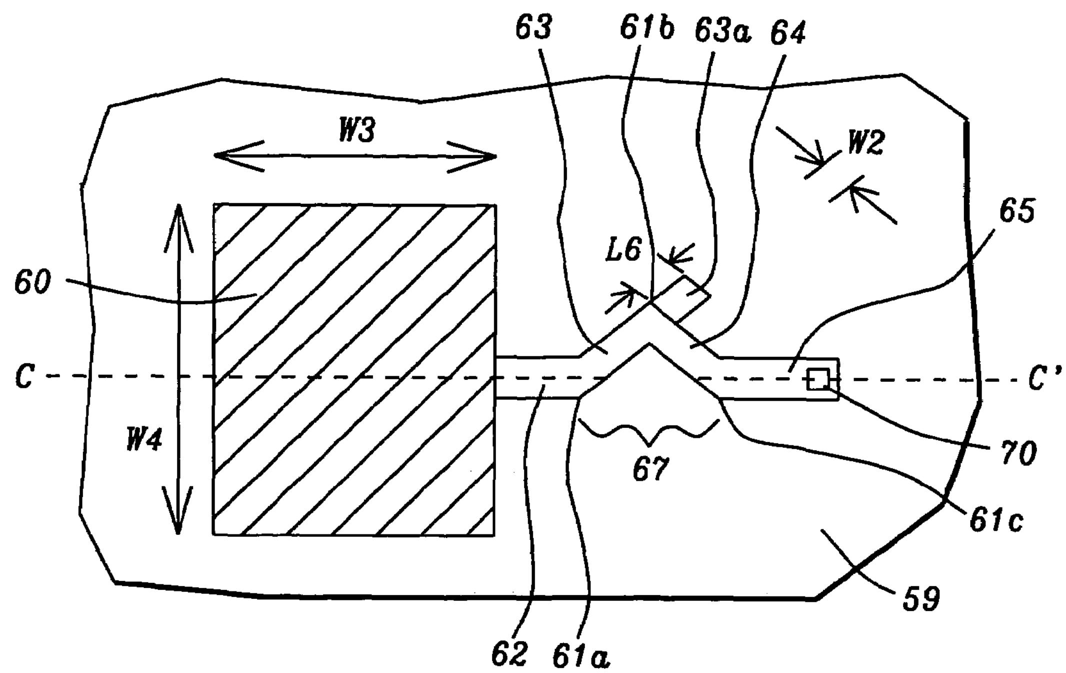

FIG. 14 is a top-down view of the wiring structure in FIG. 11 with an extension on one end of the second segment.

Figure 15:
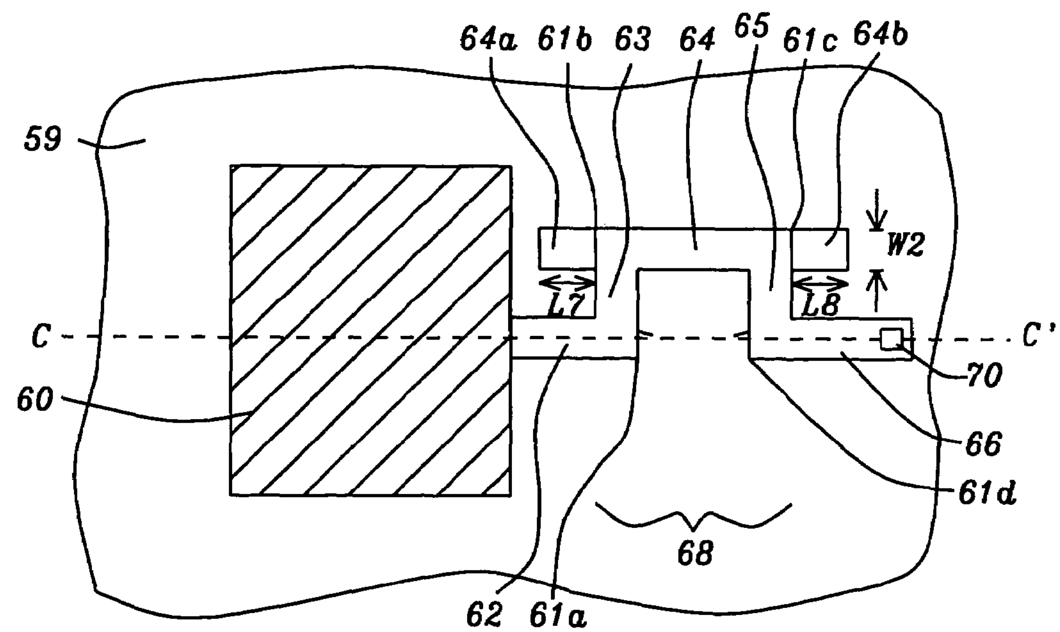

FIG. 15 is a top-down view of the wiring structure in FIG. 12 with an extension on each end of a third segment.

DETAILED DESCRIPTION OF ILLUSTRATIVE EMBODIMENTS

The present invention relates to a wiring structure that has improved resistance to stress induced void formation and is also a method for forming the same. The drawings are provided by way of example and are not intended to limit the scope of the invention. For example, the various elements within the drawings are not necessarily drawn to scale. A via test structure that includes the wiring structure of the present invention is described in the first embodiment. The wiring structure is incorporated into an interconnect as described in the second through fifth embodiments of the invention.

In the first embodiment depicted in FIGS. 3-7, a via test structure formed on a semiconductor substrate is used to measure via resistance and is particularly useful for providing a more accurate determination of the lifetime of a via during a reliability stress test. The present invention also provides for a method that employs the novel via test structure to determine via resistance during a reliability stress test.

Figure 3:
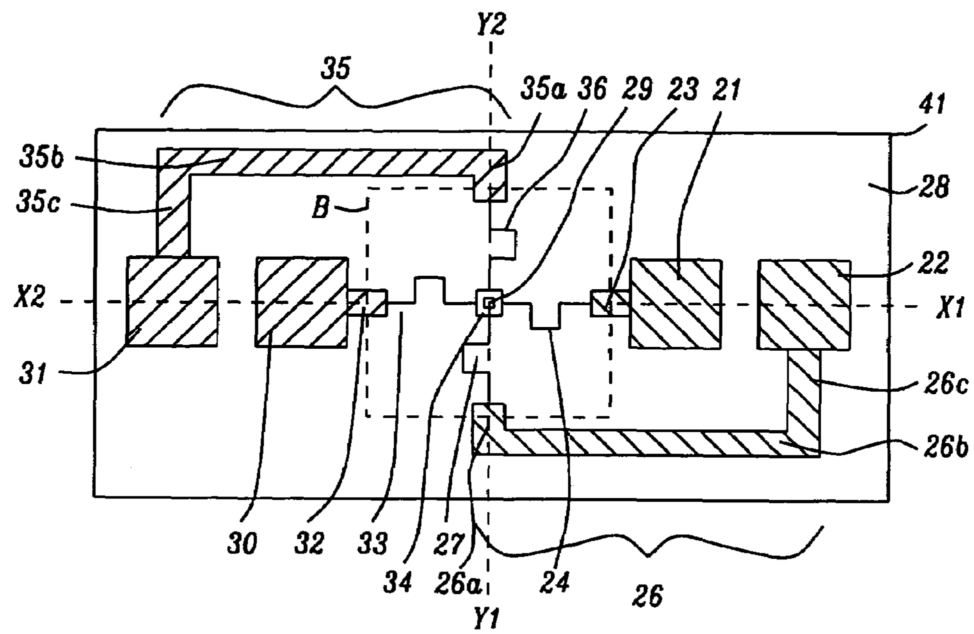
FIG. 3 is a top-down view of the via test structure of a preferred embodiment of the present invention that includes bonding pads and metal lines that are connected to a via and which is used to obtain resistance measurements.

Referring to FIG. 3, a top-down view of the via test structure of a preferred embodiment of the present invention is shown. Via test structure 41 is fabricated on a semiconductor substrate (not shown) which is typically silicon but may also be based on other semiconductor materials used in the art. The via test structure 41 is formed in layer 28 that may be either a homogenous layer or may include one or more etch stop layers, one or more low k dielectric layers, and one or more cap or passivation layers. Individual dielectric layers within the dielectric layer 28 are not depicted in order to focus attention on the design of the metal layers within the via test structure 41.

Conventional methods are employed to fabricate a first metal layer which includes a first bonding pad 21 and a second bonding pad 22. The first metal layer is typically comprised of copper but optionally may be W, an Al/Cu alloy, Al, a refractory metal or metal compound, a metal silicide, and the like. The bonding pad 21 is connected to the bottom of a via 29 by a first metal line that is also formed in the first metal layer. The via 29 has a top, a bottom, a width, a height, and sidewalls. The first metal line is comprised of three segments which are a first segment (not shown) below the via 29, a second or middle segment 24 that has a serpentine (bending) pattern, and a third segment 23 which is in contact with the bonding pad 21. The bonding pad 22 is connected to the bottom of the via 29 by a second metal line also formed in the first metal layer. The bonding pads 21, 22 are preferably formed along a first axis X1 that passes through the middle of the bonding pads 21, 22 and also passes through the bottom of the via 29.

The second metal line is comprised of a first segment (not shown) below the via 29, a middle segment 27 that has a serpentine pattern, and a third segment 26 which abuts the bonding pad 22. Note that the first segment of the first metal line and the first segment of the second metal line may both be embodied in a single metal feature. Each metal line and a segment within a metal line has two ends, a width, a length, and a thickness. The third segment 26 of the second metal line in the first metal layer preferably has three subsegments 26*a*, 26*b*, 26*c* although other designs are acceptable. In the exemplary embodiment, one end of the subsegment 26*a* is connected to an end of the middle segment 27 and is formed along a second axis Y1 that is perpendicular to axis X1. The axis X1 intersects the axis Y1 at the bottom of the via 29. The subsegment 26*b* abuts the subsegment 26*a* and is formed along an axis that is perpendicular to axis Y1. The subsegment 26*c* abuts the subsegment 26*b* on one end and adjoins the bonding pad 22 on the other end. The length of subsegments 26*a*, 26*b*, 26*c* are preferably about 1 to 10 microns, 1 to 10 microns, and 1 to 10 microns, respectively.

Conventional methods are used to fabricate a second metal layer that includes the via 29, a first bonding pad 30, and a second bonding pad 31. The second metal layer is typically comprised of copper but may be W, an Al/Cu alloy, Al, a refractory metal or metal compound, a metal silicide, and the like. The second metal layer is preferably, but not necessarily, formed of substantially the same material. The bonding pad 30 is connected to the top of the via 29 by a first metal line that is comprised of a first segment 34 above the via 29, a middle segment 33 having a serpentine pattern, and a third segment 32 that is in contact with the bonding pad 30. The bonding pad 31 is connected to the top of the via 29 by a second metal line which is comprised of a first segment 34 above the via 29, a middle segment 36 having a serpentine pattern, and a third segment 35 that adjoins bonding pad 31. The first segment 34, middle segments 33, 36 and third segments 32, 35 are also formed in the second metal layer. The bonding pads 30, 31, 21, 22 typically have a width of about 20 to 100 microns and a length from about 20 to 100 microns.

The bonding pads 30, 31 are preferably formed along a third axis X2 that is parallel to the first axis X1. The third axis X2 passes through the middle of the bonding pads 30, 31 and also passes through the top of the via 29. The third segment 35 of the second metal line in the second metal layer preferably has three subsegments 35*a*, 35*b*, 35*c*. One end of the subsegment 35*a* is connected to an end of the middle segment 36 and is formed along a fourth axis Y2 that is preferably perpendicular to axis X2. The axis Y2 intersects the axis X2 at the top of the via 29. The subsegment 35*b* abuts the subsegment 35*a* and is formed along an axis that is perpendicular to axis Y2. The subsegment 35*c* abuts the subsegment 35*b* on one end and adjoins the bonding pad 31 on the other end. The lengths of the subsegments 35*a*, 35*b*, 35*c* are about 1 to 10 microns, 1 to 10 microns, and 1 to 10 microns, respectively.

In other embodiments (not illustrated), the middle serpentine segment may be omitted from the first and second metal lines of the second metal layer (in other words, segments 33 and 36 may be omitted). In yet other embodiments, serpentine segments 33 and 36 may be employed, but middle serpentine segments 24 and 27 of the first metal layer may be omitted.

Figure 4:
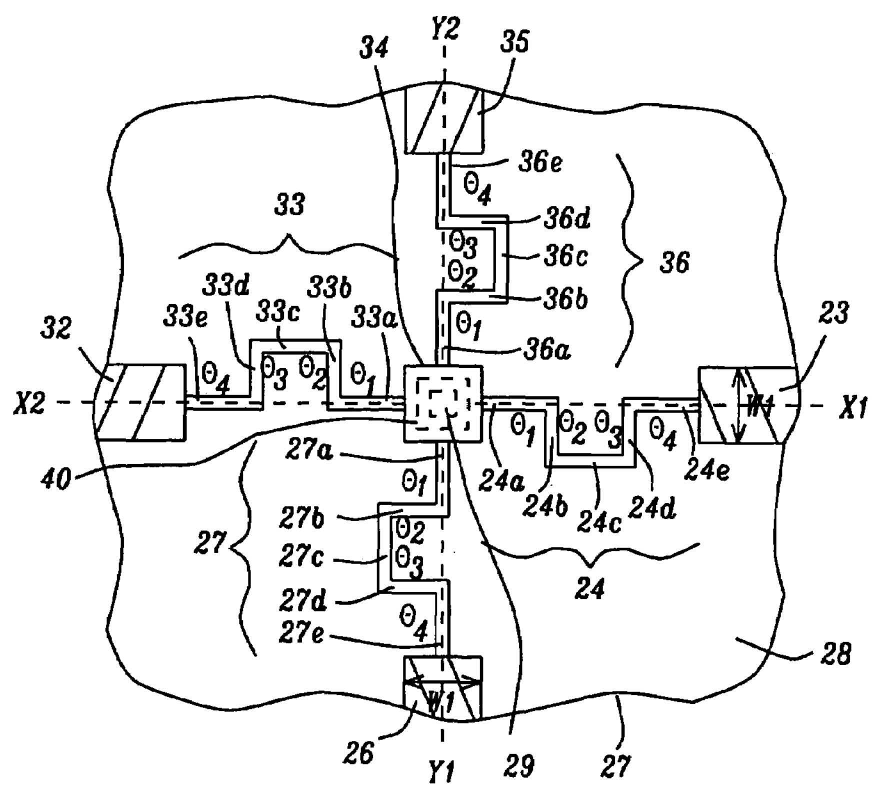
FIGS. 4-5 are enlarged top-down views of the center portion of FIG. 3 that depict the serpentine shape of the middle segments of the metal lines that connect the via to the bonding pads.

Referring to FIG. 4, this drawing is an enlarged top-down view of the portion of FIG. 3 that lies within the dashed lines that form a box B. The first metal line in the first metal layer includes the first segment 40, middle segment 24, and third segment 23 and connects the bottom of the via 29 with the bonding pad 21. The first segment 40 includes one end of the first metal line and is centered below the via 29. The first segment 40 is connected on the other end to an end of the middle segment 24. The third segment 23 includes the other end (not shown) of the first metal line and is connected on the second end to the other end of the middle segment 24. The first segment 40 and the third segment 23 preferably have a width $w_1$ of about 0.5 to 10 microns. The length of first segment 40 is the distance along the first axis X1 which is $w_1$. The length of the third segment 23 is about 0.5 to 10 microns.

An advantageous feature of the first embodiment is the structure of the middle segments which are comprised of a plurality of "n" overlapping subsegments each having two ends, a length, and a thickness that is equal to the thickness of the first and third segments in a metal line. In the exemplary embodiment pictured in FIG. 4, a middle segment has five subsegments and forms one bending portion. For example the middle segment 24 has a first subsegment 24*a*, which is formed along the first axis X1 and has one end which adjoins one end of the first segment 40. A second subsegment 24*b* with two ends has one end that overlaps the other end of the first subsegment 24*a* to form a first bend with an angle $\theta_1$ which is preferably about 45° to 135°. A third subsegment 24*c* has one end that overlaps the other end of the second subsegment 24*b* to form a second bend with an angle $\theta_2$ which is preferably about 45° to 135°. Likewise, a fourth subsegment 24*d* and a fifth subsegment 24*e* overlap a preceding subsegment to form third and fourth bends having angles $\theta_3$ and $\theta_4$, respectively, which are preferably about 45° to 135°. The fifth subsegment is preferably formed along the axis X1 or along an axis parallel to the axis X1 and has one end that overlaps an end of the fourth subsegment 24*d* while the other end overlaps and adjoins an end of the third segment 23. The bending portion is comprised of the subsegments 24*b*, 24*c*, 24*d*. Note that the middle segment 24 has two more subsegments than in a bending portion.

Those skilled in the art will appreciate that other designs for a middle segment are possible. For example, there may be 4 subsegments in which a first and fourth subsegment are formed along an axis that includes a first segment while second and third subsegments form a bending portion. Alternatively, there may be a plurality of subsegments in a bending portion that form the shape of an arc. However, in an embodiment with a plurality of "n" subsegments, the middle segment preferably has at least two more subsegments than in a bending portion because the first subsegment and preferably the nth subsegment are formed along the same axis as a first segment and are not included in the bending portion.

The portion of the second metal line in the first metal layer that is formed along the axis Y1 includes the first segment 40, middle segment 27, and third segment 26*a* and connects the bottom of the via 29 with the bonding pad 22. The first segment 40 is centered below the via 29 as described previously and also connects to one end of the middle segment 27. One end of the third segment 26*a* is connected to the other end of the middle segment 27. The third segment 26*a* has a width $w_1$ of about 0.5 to 50 microns and a length that is about 0.5 to 50 microns.

In the exemplary embodiment, the middle segment 27 has five subsegments including a first subsegment 27*a* which is formed along the second axis Y1 and has one end which adjoins one end of the first segment 40. A second subsegment 27*b* with two ends has one end which overlaps the other end of the first subsegment 27*a* to form a first bend with an angle $\theta_1$ that is from about 45° to 135°. A third subsegment 27*c* has one end that overlaps the other end of the second subsegment 27*b* to form a second bend with an angle $\theta_2$ that is from about 45° to 135°. Likewise, a fourth subsegment 27*d* and a fifth subsegment 27*e* overlap a preceding subsegment to form third and fourth bends having angles $\theta_3$ and $\theta_4$, respectively, which are from about 45° to 135°. The fifth subsegment is preferably formed along the axis Y1 or along an axis parallel to the axis Y1 and has one end that overlaps an end of subsegment 27*d* while the other end adjoins the third segment 26*a*. Optionally, other designs for the middle segment 27 are possible as described previously for the middle segment 24.

In the second metal layer, the first metal line that consists of the first segment 34, middle segment 33, and third segment 32 connects the top of the via 29 with the bonding pad 30. The first segment 34 includes one end of the first metal line and is centered above the via 29. The first segment 34 has a second end that is connected to one end of the middle segment 33. The third segment 32 includes the other end (not shown) of the first metal line and has a second end connected to the other end of the middle segment 33. The first segment 34 has a width $w_1$ and a length along the third axis X2 which is $w_1$. The third segment has a width $w_1$ and a length of about 0.5 to 50 microns.

The middle segments 33, 36 are comprised of a plurality of "n" subsegments each having two ends, a length, and a thickness that is equal to the thickness of the first and third segments in the second metal layer. In the exemplary embodiment, the middle segment 33 has five subsegments including a first subsegment 33*a*, which is formed along the third axis X2 and has one end that adjoins one end of the first segment 34. A second subsegment 33*b* has one end that overlaps the other end of the first subsegment 33*a* to form a first bend with an angle $\theta_1$ which is from about 45° to 135°. A third subsegment 33*c* has one end that overlaps the other end of the second subsegment 33*b* to form a second bend with an angle $\theta_2$. A fourth subsegment 33*d* and a fifth subsegment 33*d* overlap a preceding subsegment to form third and fourth bends having angles $\theta_3$ and $\theta_4$, respectively. The angles $\theta_2$-$\theta_4$ are from about 45° to 135°. The fifth subsegment is preferably formed along the axis X2 or along an axis parallel to axis X2 and has one end that overlaps an end of the subsegment 33*d* while the other end adjoins the third segment 32. Optionally, other designs for the middle segment 33 are possible as described previously for the middle segment 24.

The portion of the second metal line in the second metal layer that is formed along the axis Y2 includes the first segment 34, middle segment 36, and third segment 35*a* and connects the top of the via 29 with the bonding pad 31. The first segment 34 is centered above the via 29 as described previously and is connected to one end of the middle segment 36. One end of the third segment 35*a* is connected to the other end of the middle segment 36. The third segment 35*a* has a width $w_1$ and a length that is about 0.5 to 50 microns.

In the exemplary embodiment, the middle segment 36 has five subsegments including a first subsegment 36*a* which is formed along the fourth axis Y2 and has one end which adjoins one end of the first segment 34. A second subsegment 36*b* with two ends has one end which overlaps the other end of the first subsegment 36*a* to form a first bend with an angle $\theta_1$. A third subsegment 36*c* has one end that overlaps the other end of the second subsegment 36*b* to form a second bend with an angle $\theta_2$. Likewise, a fourth subsegment 36*d* and a fifth subsegment 36*e* overlap a preceding subsegment to form third and fourth bends having angles $\theta_3$ and $\theta_4$, respectively. Angles $\theta_1$-$\theta_4$ are about 45° to 135°. The fifth subsegment is preferably formed along axis Y2 or along an axis parallel to the axis Y2 and has an end that overlaps an end of the subsegment 27*d* while the other end abuts the third segment 26*a*. As previously indicated, other designs for the middle segment 36 are possible which involve a plurality of overlapping subsegments and at least one bending portion.

It is understood that when a middle segment is comprised of a plurality of "n" overlapping subsegments, that (n−1) bends are formed and one end of the first subsegment is connected to the first segment while one end of the nth subsegment is connected to the third segment. The total length of a middle segment is defined as the sum of the lengths of the n subsegments.

Figure 5:
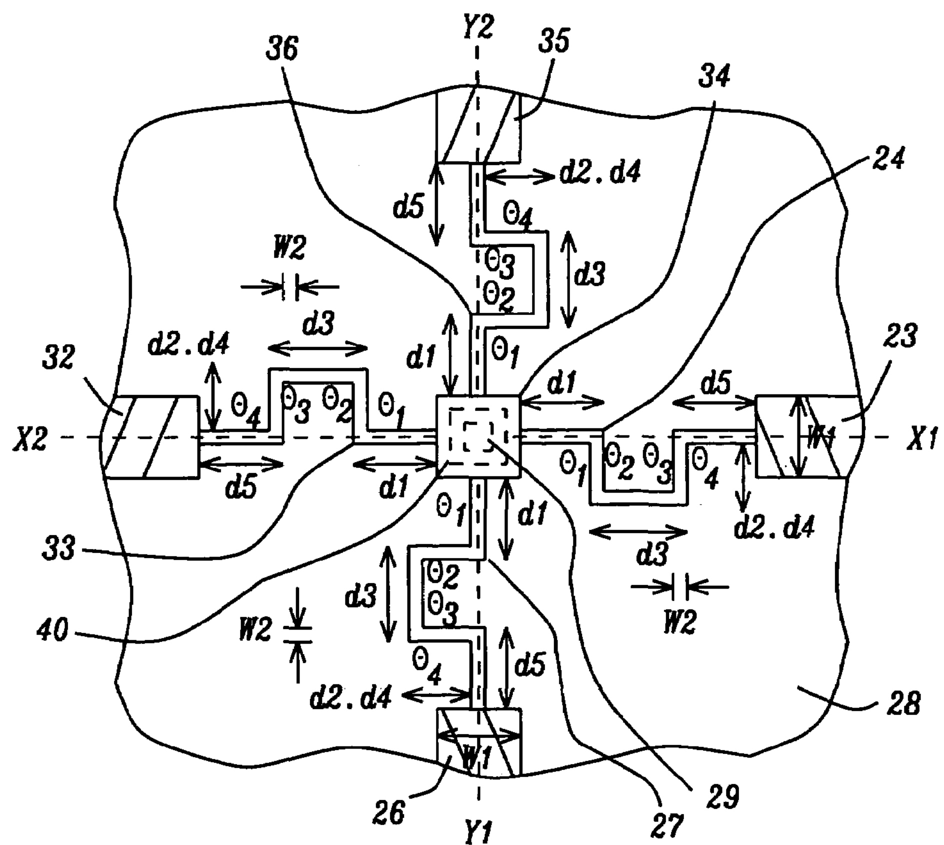

Referring to FIG. 5, the test structure in FIG. 4 is illustrated to indicate presently preferred widths and lengths of the various subsegments. Note that a first subsegment in each of the middle segments 24, 27, 33, 36 has a length d, while a second subsegment has a length $d_2$. Third, fourth, and fifth subsegments have a length $d_3$, $d_4$, $d_5$, respectively. Furthermore, the width $w_2$ of all subsegments is less than $w_1$ and preferably in the range of 0.5 to 50 microns. In one embodiment, the lengths $d_1$-$d_5$ are all equivalent. Alternatively, one or more of the lengths $d_1$-$d_5$ may have different sizes.

Figure 6:
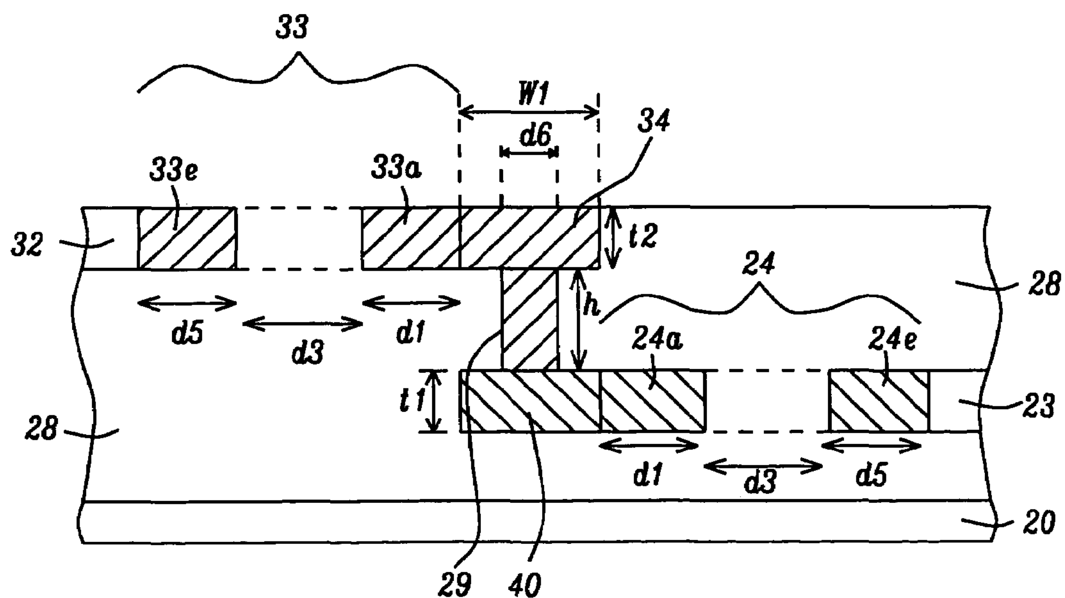
FIG. 6 is a cross-sectional view showing a first metal line in a first metal layer and a first metal line in a second metal layer according to the via test structure of a preferred embodiment of the present invention.

Referring to FIG. 6, a cross-sectional view of the via test structure is shown that is obtained by a cut along the axes X1 and X2 in FIG. 4. A portion of the first metal line in the first metal layer is depicted and is comprised of the first segment 40, third segment 23, and two subsegments 24*a*, 24*e* of the middle segment 24. The other three subsegments 24*b*-24*d* are in front of the plane of the drawing as indicated by the dashed lines connecting the subsegments 24*a*, 24*e*. A portion of the first metal line in the second metal layer is also shown and is comprised of the first segment 34, third segment 32, and two subsegments 33*a*, 33*d* of the middle segment 33. The other three subsegments 33*b*-33*d* are behind the plane of the drawing as indicated by the dashed lines connecting the subsegments 33*a*, 33*d*. The thickness $t_1$ of the first metal line in the first metal layer is between about 0.2 to 1 microns and the thickness $t_2$ of the first metal line in the second metal layer is from about 0.2 to 1 microns, although $t_1$ and $t_2$ are not necessarily the same thickness. The first segment 34 is preferably centered above the via 29 while the first segment 40 is preferably centered below the via 29 which preferably has a height h of about 0.4 to 1 microns and a width $d_6$ of about 0.1 to 1 microns.

Referring to FIG. 7, a cross-sectional view of the via test structure is shown that is obtained by a cut along the axes Y1 and Y2 in FIG. 4. A portion of the second metal line in the first metal layer is depicted and is comprised of the first segment 40, third segment 26*a*, and two subsegments 27*a*, 27*e* of the middle segment 27. The other three subsegments 27*b*-27*d* are behind the plane of the drawing. A portion of the second metal line in the second metal layer is also shown and is comprised of the first segment 34, third segment 35*a*, and two subsegments 36*a*, 36*e* of the middle segment 36. The other three subsegments 36*b*-36*d* are in front of the plane of the drawing. The second metal line in the first metal layer has a thickness $t_1$ and the second metal line in the second metal layer has a thickness $t_2$.

The present invention also provides for a method of using the via test structure 41 in a reliability test. A reliability test is conducted by obtaining a first via resistance measurement before the via 29 is physically stressed. A current $I_O$ of about 1 milliamp (ma), for example, is applied at the bonding pad 21 and a voltage $V1_O$ is measured at the bonding pad 22 and a voltage $V2_O$ is measured at the bonding pad 31. The bonding pad 30 is grounded to zero volts. The initial resistance $R_O$ of the via 29 is determined as $R_O=(V1_O-V2_O)/I_O$. The test structure 41 is then heated at an elevated temperature of about 175° C. for a period of time that may encompass hundreds of hours while a current continues to be applied. The elevated temperature stresses the via 29 in order to approximate the lifetime of the via at a lower temperature near room temperature. A device failure is said to occur at a time t when the resistance $R=(V1_t-V2_t)/I_t$ of the via 29 increases by a predetermined percentage over the initial resistance value $R_O$.

An advantageous feature of the preferred embodiments of the present invention is that the test structure, particularly the middle segment with the serpentine pattern in a first or second metal line, prevents or impedes vacancies in the bonding pads 21, 22, 30, 31 from migrating to the via 29. It is believed that the diffusion coefficient for voids in the bonding pads to migrate through a metal line to a via are reduced compared to prior art via test structures because of one or more bending portions in the middle segment of the metal line. Thus, voids that are prematurely formed in other via test structures because of void diffusion from a large metal reservoir such as a bonding pad are blocked or delayed in the test structure of the first embodiment.

In the second through fifth embodiments, the wiring structure of the present invention is incorporated into an interconnect structure. The wiring structure is not particularly limited to any semiconductor device and may be applied to any technology wherein electromigration in an interconnect structure comprised of a first conducting layer that is connected by a via to a second conducting layer is a concern. Although the drawings depict an interconnect structure in which an elongated conducting line (protrusion) connects a first conducting layer to a via having an overlying second conducting layer, other designs are anticipated. For instance, the second conducting layer may be a metal line which is connected to more than one via in one or more first conducting layers. Furthermore, the area of the second conducting layer may be greater than the area of the first conducting layer when observed from a top-down view.

In a second embodiment depicted in FIGS. 11-12, a wiring structure is formed on a substrate and is comprised of a first conducting layer having a large area portion with a first thickness, a first width, a first length, and a plurality of sides and a protrusion having a first thickness, second width, and second length with two ends and at least one bending portion. One end of the protrusion is connected to one side of the large area portion while the other end is connected to the bottom of a via that adjoins an overlying second conducting layer.

Referring to FIG. 11, a method of forming the first conducting layer in the interconnect structure of the present invention is described. A substrate 57 is shown upon which an etch stop layer 58 and a dielectric layer 59 have been sequentially deposited by a chemical vapor deposition (CVD) method, plasma enhanced CVD (PECVD) method, or the like. The substrate 57 is typically comprised of silicon and may include active and passive devices (not shown). The etch stop layer 58 is generally one of silicon nitride, silicon oxynitride, or silicon carbide. The dielectric layer may be $SiO_2$ or a low k dielectric material such as fluorine doped $SiO_2$, carbon doped $SiO_2$, a silsesquioxane, a polyarylether, benzocyclobutene, or a polyimide. Alternatively, the etch stop layer 58 and dielectric layer 59 may be replaced by a stack of dielectric layers including at least one etch stop layer and at least one dielectric layer as appreciated by those skilled in the art.

A damascene process sequence is performed which includes a photoresist patterning process and one or more etch steps to form an opening in the stack of dielectric layers, a deposition process that fills the opening with a first conducting layer, and a planarization process that makes the first conducting layer coplanar with the top of the stack of dielectric layers. This damascene process sequence is well known to those skilled in the art and is not described herein. The first conducting layer includes a large area portion 60 and a protrusion comprised of a first segment 62 on one side of the large area portion that are coplanar with the dielectric layer 59. An advantageous feature is that the protrusion is further comprised of a plurality of segments and at least one bending portion that are not shown in this view. One end of the protrusion is connected to the large area portion and the other end is connected to a via (not shown) with an overlying second conducting layer. Optionally, a diffusion barrier layer (not shown) is formed on the sidewalls of the opening before the first conducting layer is deposited. The first conducting layer has a first thickness of about 0.2 to 1 Angstroms. Although the first conducting layer is preferably copper, other material like Al/Cu, W, or Al, may be used to form the first conducting layer.

Returning to FIGS. 8*a* and 8*b*, it has been observed that if a via and an overlying second conducting layer (not shown) are connected to the protrusion 52 near the end opposite the large area portion 50 and a stress test is performed as described previously in the first embodiment, there is a greater resistance to forming a void adjacent to the via when the length of the protrusion is increased as shown in FIG. 9. In FIG. 9, the test result expressed by resistance shift, on a test pattern with a protrusion as shown in FIG. 8*b*, is almost unique among the test samples as curve 53, while the test result on a test pattern without a protrusion as shown in FIG. 8*a* has some resistance shift (which means resistance increases) in test samples, leaving a tail curve shown by curve 54. Furthermore, it has also been observed that the same test pattern with different protrusion lengths would result in different resistance to void forming. For example, two test patterns as shown in FIG. 8*b* with the same size of pad 50 and a different length of protrusion 52 are tested. The test pattern having a longer protrusion results in less possibility of resistance increase, while the other test pattern with a shorter protrusion length results in a higher possibility of resistance increase as measured during a stress test. A higher possibility of resistance increase indicates that a larger number of vacancies have accumulated near the via to cause a higher resistivity as a result of the stress test.

Referring to FIG. 11, the wiring structure of the second embodiment is illustrated in a top-down view of a first conducting layer of an interconnect in which the protrusion that connects a large area portion with a via has four segments and one bending portion comprised of two segments. The first conducting layer is comprised of the large area portion 60 having a first width w3, a first length w4, and a first thickness, and a protrusion that has four overlapping segments each having a width w2, a length, two ends, and a first thickness. Typically w3 is from about 50 to 100 microns, w4 is from about 50 to 100 microns, w2 is between about 50 to 100 microns, and the first thickness is from 0.4 to 1.0 microns.

A first segment 62 has a length L1 and is formed along the axis C—C' which is preferably substantially perpendicular to one side of the large area portion 60 and has an end adjoining the large area portion. One end of a second segment 63 having a length L2 overlaps the other end of the first segment 62 and forms a bend 61*a* at an angle $\theta_1$ of about 45° to 135°. One end of a third segment 64 with a length L3 overlaps the other end of the second segment 63 to form a bend 61*b* having an angle $\theta_2$ of about 45° to 135°. There is a fourth segment 65 with one end that overlaps the other end of the third segment 64 to form a bend 61*c* with an angle $\theta_3$ of about 45° to 135°. The fourth segment 65 that has a length LA is preferably formed along the axis C—C' or along an axis that is parallel to C—C'. A location near the second end of the fourth segment 65 is indicated where a via 70 and an overlying second metal layer (not shown) are positioned. The length of the protrusion is now the sum of L1+L2+L3+M4 and is longer than the original length connecting large portion area 60 and via 70 in the form of a straight line. The bending portion 67 is defined as the portion of the protrusion comprised of the segments 63, 64.

Referring to FIG. 12, a third embodiment is depicted in which the protrusion that connects a large area portion with a via in a first conducting layer is comprised of five segments and one bending portion that has three segments. The first conducting layer is comprised of the large area portion 60 having a first width w3, a first length w4, and a first thickness and a protrusion that has five overlapping segments each having a width w2, a length, two ends, and a first thickness. The first segment 62, second segment 63, and third segment 64 are formed substantially as described above. One end of a fourth segment 65 with a length MA overlaps the end of the third segment 64 that does not overlap the second segment 63 to form a bend 61*c* with an angle $\theta_3$ of about 45° to 135°. There is a fifth segment 66 with an end that overlaps the other end of the fourth segment 65 to form a bend 61*d* with an angle $\theta_4$ of about 45° to 135°. The fifth segment 66 that has a length L5 is preferably formed along the axis C—C' or along an axis that is parallel to C—C'. A location near the second end of the fifth segment 66 is indicated where a via 70 and an overlying second metal layer (not shown) are positioned. The length of the protrusion is now the sum of L1+L2+L3+L4+L5 and is longer than the original length connecting large portion area 60 and via 70 in the form of a straight line. The bending portion 68 is defined as the portion of the protrusion comprised of the segments 63, 64, 65. Note that the protrusion has two more segments than in a bending portion.

Besides extending the length of the protrusion 52, adding a bending portion serves further to retard the diffusion of vacancies from the large area portion 60 to the via 70. Thus, the resistivity increase exhibited during a stress test of an interconnect with a single segment is further minimized with the addition of a plurality of overlapping segments and at least one bending portion. As a result, a higher reliability is achieved in the final device. Note that the cross-section illustrated in FIG. 13 was obtained along the axis C—C' of the wiring structure shown in FIG. 12. While large area portion 60 is shown as being rectangular and having four sides, those skilled in the art will recognize that other shapes and sizes are within the scope of the present invention.

Those skilled in the art will appreciate that other embodiments are possible in which the protrusion of the present invention may be comprised of a plurality of "n" segments, "n−1" bends, and a plurality of bending portions. Furthermore, each bending portion may be comprised of a plurality of segments. For example, a first segment and an nth segment may be formed along a first axis while a plurality of segments in the shape of an arc connect the first and nth segments. Preferably, the first segment is formed along an axis that is perpendicular to the side of the large area portion to which the first segment is attached and the nth segment is formed along the same axis as the first segment or along an axis that is parallel to the axis of the first segment.

The method of forming a wiring structure having a plurality of segments and at least one bending portion is continued by forming a second conducting layer comprised of a via and an overlying second conducting layer above the first conducting layer in a dual damascene process. Referring to FIG. 13, an exemplary embodiment is shown where an etch stop layer 68 and a dielectric layer 69 are sequentially deposited on the dielectric layer 59, the large area portion 60, and on the protrusion comprised of the first segment 62 and fifth segment 66. Second, third, and fourth segments 63-65 are not pictured in this view but are also covered by the etch stop layer 68. It is understood that the protrusion may be optionally comprised of a plurality of "n" segments with "n−1" bends and at least one bending portion as described previously. The etch stop layer 68 and dielectric layer 69 are generally deposited by a CVD or plasma enhanced CVD method and may have the same composition as the etch stop layer 58 and dielectric layer 59, respectively. Alternatively, the etch stop layer 68 and dielectric layer 69 may be replaced by a stack of dielectric layers that includes at least one etch stop layer and at least one dielectric layer as appreciated by those skilled in the art.

A first photoresist patterning and etch sequence (not shown) is employed to form a via 70 in the dielectric layer 69. Then a second photoresist patterning and etch sequence (not shown) is used to form a trench 71 that is aligned above the via 70 and to extend the via 70 through the etch stop layer 68 to expose a portion of the last segment in the protrusion. It is an advantageous feature of the method of the present invention that the via 70 connects the end of the protrusion comprised of the highest numbered or nth segment. More specifically, the via 70 is formed near the end of the nth segment that does not overlap the (n−1)th segment. The via 70 has a top, a bottom, and a height preferably of about 0.2 to 1 micros, and a width that is preferably less than the width W2 of the nth segment. Preferably, there could be a distance D from the bottom of the via to the end of the last segment 66, for example, that is less than about 1 micron to allow for some misalignment in overlaying the via 70 on the nth segment of the protrusion.

In one embodiment, a conformal diffusion barrier layer (not shown) is formed on the sidewalls and bottoms of the via 70 and trench 71 by a CVD, PECVD, or atomic layer deposition (ALD) technique. A second conducting layer 72 that is preferably copper is deposited to fill the via 70 and trench 71 by electroplating, electroless plating, or physical vapor deposition (PVD), for example. The thickness of the second conducting layer within the trench 71 is typically about 0.2 to 1 microns. Optionally, the second conducting layer 72 may substantially comprise Cu, Al, W, Ti, or other conductor.

It is important that the width of the second conducting layer within the trench 71 is wider than the width of the via 70 and that the top of the via is completely covered by the second conducting layer. Typically, a planarization method that is a chemical mechanical polish process is employed to lower the level of the second conducting layer 72 to become coplanar with the dielectric layer 69. The area of the second conducting layer from a top-down view may be larger or smaller than the area of the large area portion of the first conducting layer. In addition to the improved reliability of the resulting interconnect in FIG. 13, a higher product yield is achieved that lowers the overall cost of producing the interconnect by employing a wiring structure of the present invention.

It has also been discovered that the addition of an extension on one end of a segment in a bending portion of a protrusion is effective in further delaying the diffusion of vacancies in the first conducting layer from a large area portion through a protrusion to a via near the end of the protrusion. In the embodiment shown in FIG. 14, an extension is attached at the end of one segment in a protrusion in a wiring structure.

Referring to FIG. 14, the wiring structure shown in FIG. 11 is modified to incorporate an extension 63*a* that extends from the end of the second segment 63 and beyond the bend 61*b* formed by the overlap of the second segment 63 with the third segment 64. The extension has a width W2, a length L6 of about 0.1 to 1 microns, and a first thickness and is formed of the same conducting material as in the first conducting layer.

Alternatively, an extension (not shown) having a width W2 and a length that may or may not be equal to L6 may be formed on the end of the third segment 64 adjacent to the extension 63*a* at the bend 61*b*. Still another option is to include an extension at the end of the third segment 64 at the bend 61*b* and to omit the extension 63*a*.

A wiring structure with a protrusion having a plurality of "n" segments and at least one extension on a bending portion has improved resistance to void formation near the bottom of the via 70 at the end of the nth segment compared with a prior art wiring structure. It is believed that some of the vacancies in the large area portion 60 which migrate towards the via 70 are temporarily trapped within an extension which delays their migration through the protrusion to the bottom of the via 70. Similarly, an extension may also be formed on a non-bending portions subsegment, such as extending laterally from subsegment 62 or 65. One or more extensions may be added to a plurality of "n" segments in a protrusion that has at least one bending portion, such as illustrated in FIG. 15, in which the protrusion depicted in FIG. 12 has been modified to include two extensions on a bending portion 68. An extension 64*a* is formed on one end of the third segment 64 beyond the bend 61*b* and is aligned along the same axis that bisects the two ends of the third segment 64. The extension 64*a* has a width W2 and a length L7 of about 0.01 to 1 microns. A second extension 64*b* is formed on the other end of the third segment 64 beyond the bend 61*c* along the same axis that bisects the two ends of the third segment. The extension 64*b* has a width W2 and a length L8 of about 0.01 to 1 microns. Note that L7 is not necessarily equal to L8. Moreover, the length L7 is preferably significantly less than the length L1 of the first segment 62 so as not to enable a metal bridge (not shown) to form between the extension 64*a* and the large area portion 60 during the interconnect fabrication process.

Those skilled in the art will appreciate that up to 2(n−1) extensions may be added to a protrusion in the wiring structure of the present invention. For instance, one extension may be formed on each of the two segment ends at a bend. In an embodiment where the protrusion has "n" segments and "n−1" bends, then the maximum number of possible extensions is 2(n−1). Optionally, each of the "n−1" bends may have 0 or 1 extensions. An advantageous feature is that at least one of the segments has an extension located at a bend in order to delay the diffusion of vacancies through the protrusion.

The embodiments illustrated in FIGS. 14 and 15 provide an additional advantage over the benefits of the previously described embodiments in that for a given length of the protrusion which is the sum of all the segment lengths (L1, . . . Ln) the resistance to void formation is increased by the inclusion of at least one extension on a segment end. Thus, the reliability of the resulting device is further improved by incorporating at least one extension. In other words, the combination of a protrusion, at least one bending portion, and at least one extension on a segment end would maximize the resistance to void formation near a via formed between a large area metal portion and a second conducting layer.

While this invention has been particularly shown and described with reference to the preferred embodiments thereof, it will be understood by those skilled in the art that various changes in form and details may be made without departing from the spirit and scope of this invention.

What is claimed is:

1. A wiring structure connecting a metal feature having a length, width, and thickness to a via, comprising:

a single conducting layer comprising plurality of "n" overlapping segments each comprised of two ends and having a width, a length, and a thickness wherein one end of a first segment is connected to the metal feature and one end of the nth segment is connected to the via and wherein an end of a segment and an end of an adjacent segment form a bend at an angle θ and a plurality of segments form at least one bending portion, and wherein the width of each of the plurality of segments forming the at least one bending portion is less than the width of the first segment.

2. The wiring structure of claim 1 wherein the metal feature, "n" overlapping segments, and via are comprised of copper.

3. The wiring structure of claim 1 wherein the first segment is fanned along a first axis and the nth segment is formed along the first axis or along an axis that is parallel to the first axis and the bending portion is not aligned along the first axis.

4. The wiring structure of claim 1 wherein the width of a segment is less than the width or length of the metal feature.

5. The wiring structure of claim 1 wherein the combined length of the "n" segments is greater than about 10 microns.

6. The wiring structure of claim 1 wherein the angle θ is between about 45° and 135°.

7. The wiring structure of claim 1 further comprising at least one extension formed on one end of a segment and substantially aligned along the same axis as formed by the two ends of the segment.

8. An interconnect, comprising:

(a) a first conducting layer including a large area portion having a first width, a first length, and a first thickness, the first conducting layer further including elongated protrusion having a second width and length, first thickness, and two ends, wherein one end is connected to the large area portion and the other end is connected to a via and said protrusion is comprised of at least one bending portion, and wherein the protrusion has a substantially uniform width throughout its length and extends over the via;

(b) the via being connected at a first end to the protrusion in the first conducting layer and at a second end to a second conducting; and (c) the at least one bending portion comprising two or more intersecting subportions, wherein at least one extension extends beyond an intersection of said two or more intersection subportions.

9. The interconnect structure of claim 8 wherein said protrusion is comprised of a plurality of "n" overlapping segments and a bending portion that includes a plurality of segments in which an end of one segment and an end of an adjacent segment overlap to form a bend at an angle θ.

10. The interconnect structure of claim 9 wherein the angle θ is between about 45° and 135°.

11. The interconnect structure of claim 8 wherein the bending portion has the shape of an arc.

12. The interconnect structure of claim 8 wherein the first conducting layer, second conducting layer, protrusion, and the via are comprised of a metal.

13. The interconnect structure of claim 12 wherein said metal is copper.

14. The interconnect structure of claim 8 wherein the first thickness of the first conducting layer is between about 0.2 and 1 microns, the height of the via is about 0.2 to 1 microns, and wherein the second conducting layer has a thickness of about 0.2 to 1 microns.

15. The interconnect structure of claim 9 wherein the combined length of the "n" segments in the protrusion is greater than about 10 microns and the second width of a segment is between about 0.1 and 10 microns.

16. The interconnect structure of claim 9 wherein the first segment is formed along a first axis and the nth segment is formed along the first axis or along an axis that is parallel to the first axis.

17. The interconnect structure of claim 9 wherein the via is formed on the "nth" segment at a distance of about 0.1 and 10 microns from the end of the nth segment that does not overlap with the (n−1)th segment.

18. The interconnect structure of claim 9 wherein the width of said via is less than the second width of said nth segment and the height of the via is between about 0.2 and 10 microns.

19. The interconnect structure of claim 9 further comprised of at least one extension at the end of a segment adjacent to a bend.

20. The interconnect structure of claim 19 wherein said extension has a second width, a length of about 0.01 to 1 microns, a first thickness, and is comprised of the same conducting material as in the first conducting layer.

21. A wiring structure connecting a metal feature having a length, width, and thickness to a via, comprising:

a single conducting layer comprising plurality of "n" overlapping segments each comprised of two ends and having a width, a length, and a thickness wherein one end of a first segment is connected to the metal feature and one end of the nth segment is connected to the via and wherein an end of a segment and an end of an adjacent segment form a bend at an angle θ and a plurality of segments form at least one bending portion, the at least one bending portion comprising two or more intersecting subsegments, wherein at least one extension extends beyond an intersection of said two or more intersection subsegments and wherein the width of each of the plurality of segments forming the at least one bending portion is less than the width of the first segment.

22. The wiring structure of claim 21 wherein the metal feature, "n" overlapping segments, and via are comprised of copper.

23. The wiring structure of claim 21 wherein the first segment is formed along a first axis and the rub segment is formed along the first axis or along an axis that is parallel to the first axis and the bending portion is not aligned along the first axis.

24. The wiring structure of claim 21 wherein the width of a segment is less than the width or length of the metal feature.

25. The wiring structure of claim 21 wherein the combined length of the "N" segments is greater than about 10 microns.

26. The wiring structure of claim 21 wherein the angle θ is between about 45° and 135°.

27. An interconnect, comprising:

(a) a first conducting layer including a large area portion having a first width, a first length, and a first thickness, the first conducting layer further including an elongated protrusion having a second width and length, first thickness, and two ends, wherein one end is connected to the large area portion and the other end is connected to a via and said protrusion is comprised of at least one bending portion that includes a plurality of segments in which an end of one segment and an end of an adjacent segment overlap to form a bend at an angle θ, and wherein a third width of each of the plurality of segments making up the at least one bending portion is less than the second width and wherein the protrusion extends over the via; and (b) the via being connected at a first end to the protrusion in the first conducting layer and at a second end to a second conducting.

28. The interconnect structure of claim 27 wherein said protrusion is comprised of a plurality of "n" overlapping segments.

29. The interconnect structure of claim 27 wherein the angle θ is between about 45° and 135°.

30. The interconnect structure of claim 27 wherein the bending portion has the shape of an arc.

31. The interconnect structure of claim 27 wherein the first conducting layer, second conducting layer, protrusion, and the via are comprised of a metal.

32. The interconnect structure of claim 31 wherein said metal is copper.

33. The interconnect structure of claim 27 wherein the first thickness of the first conducting layer is between about 0.2 and 1 microns, the height of the via is about 0.2 to 1 microns, and wherein the second conducting layer has a thickness of about 0.2 to 1 microns.

34. The interconnect structure of claim 28 wherein the combined length of the "n" segments in the protrusion is greater than about 10 microns and the second width of a segment is between about 0.1 and 10 microns.

35. The interconnect structure of claim 28 wherein a first segment of said plurality of segments is formed along a first axis and the nth segment is formed along the first axis or along an axis that is parallel to the first axis.

36. The interconnect structure of claim 28 wherein the via is formed on the "nth" segment at a distance of about 0.1 and 10 microns from the end of the nth segment that does not overlap with the (n−1)th segment.

37. The interconnect structure of claim 28 wherein the width of said via is less than the second width of said nth segment and the height of the via is between about 0.2 and 10 microns.

38. The interconnect structure of claim 27 further comprising:

at least one extension extending beyond said overlapping portion between said end of one segment and said end of said adjacent segment.

* * * * *

UNITED STATES PATENT AND TRADEMARK OFFICE

CERTIFICATE OF CORRECTION

PATENT NO. : 7,301,239 B2
APPLICATION NO. : 10/899,252
DATED : November 27, 2007
INVENTOR(S) : Wang et al.

It is certified that error appears in the above-identified patent and that said Letters Patent is hereby corrected as shown below:

In Col. 10, line 36, delete "33*d*" and insert --33*e*--.
In Col. 11, line 17, delete "d," and insert --$d_1$--.
In Col. 11, line 35, delete "33*d*" and insert --33*e*--.
In Col. 11, line 38, delete "33*d*." and insert --33*e*.--.
In Col. 14, line 7, delete "LA" and insert --L4--.
In Col. 14, line 12, delete "M4" and insert --L4--.
In Col. 14, line 26, delete "MA" and insert --L4--.
In Col. 17, line 32, delete "fanned" and insert --formed--.
In Col. 17, line 50, insert --an-- after including.
In Col. 18, line 61, delete "rub" and insert --nth--.
In Col. 19, line 2, delete ""N"" and insert --"n"--.

Signed and Sealed this

Fifteenth Day of April, 2008

JON W. DUDAS
*Director of the United States Patent and Trademark Office*